United States Patent
Kubo

(10) Patent No.: US 7,075,624 B2
(45) Date of Patent: Jul. 11, 2006

(54) POSITIONING APPARATUS AND METHOD FOR MANUFACTURING SAME

(75) Inventor: Hiroyoshi Kubo, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/931,991

(22) Filed: Sep. 2, 2004

(65) Prior Publication Data

US 2005/0036126 A1    Feb. 17, 2005

Related U.S. Application Data

(62) Division of application No. 10/295,851, filed on Nov. 18, 2002.

(30) Foreign Application Priority Data

Nov. 29, 2001   (JP)   .............................. 2001-364509

(51) Int. Cl.
*G03B 27/58* (2006.01)
*G03B 27/62* (2006.01)
*G03B 27/42* (2006.01)

(52) U.S. Cl. ............................. 355/72; 355/75; 355/53

(58) Field of Classification Search ................. 355/72, 355/76, 75, 53; 310/34, 12, 14; 318/625, 318/628, 687, 632; 33/503; 74/490.09
See application file for complete search history.

(56) References Cited

U.S. PATENT DOCUMENTS

| | | | |
|---|---|---|---|
| 5,524,502 A | 6/1996 | Osanai | 74/490.07 |
| 5,701,041 A | 12/1997 | Akutsu et al. | 310/12 |
| 5,858,587 A | 1/1999 | Yamane et al. | 430/22 |
| 6,188,150 B1 | 2/2001 | Spence | 310/12 |
| 6,208,408 B1 | 3/2001 | Takabayashi | 355/67 |
| 6,320,649 B1 | 11/2001 | Miyajima et al. | 355/72 |
| 6,353,271 B1 | 3/2002 | Williams | 310/12 |
| 6,442,858 B1 | 9/2002 | Asano | 33/645 |
| 2002/0189117 A1 | 12/2002 | Gotz et al. | 33/503 |

FOREIGN PATENT DOCUMENTS

| | | |
|---|---|---|
| DE | 198 05 875 C1 | 4/1999 |
| EP | 0 729 073 A1 | 8/1996 |
| JP | 5-19157 | 1/1993 |
| JP | 8-229759 | 9/1996 |
| JP | 11-142555 | 5/1999 |

OTHER PUBLICATIONS

European Search Report dated Mar. 3, 2004, issued in corresponding European patent appln. No. 02 25 8091, forwarded in a Communication dated Mar. 26, 2004.

*Primary Examiner*—Peter B. Kim
(74) *Attorney, Agent, or Firm*—Fitzpatrick, Cella, Harper & Scinto

(57) ABSTRACT

A positioning apparatus which moves an object. The apparatus includes a first plate unit that retains the object, and a second plate unit that retains the first plate unit, the second plate unit being composed of a ceramic material and comprising a hollow structure having a hollow section, the hollow structure including a rib and holes that provide a passageway between an interior and an exterior of the hollow section.

19 Claims, 11 Drawing Sheets

NO RIBS  DIAMOND  CROSS  CIRCLE  X

US 7,075,624 B2

POSITIONING APPARATUS AND METHOD FOR MANUFACTURING SAME

This application is a divisional application of copending U.S. patent application Ser. No. 10/295,851, filed Nov. 18, 2002.

BACKGROUND OF THE INVENTION

1. Field of the Invention

The present invention relates to a positioning apparatus for a stage or the like used in an apparatus or method for manufacturing devices such as semiconductor devices and liquid crystal displays. The positioning apparatus is used in, for example, a projection exposure apparatus, various precise processing apparatuses and measuring apparatuses, etc., for moving and positioning a substrate such as a semiconductor wafer, a mask, and a reticle at high speed and with high accuracy. In addition, the present invention may also be applied to a method for manufacturing a semiconductor device by using an exposure apparatus incorporating such a positioning device.

2. Description of the Related Art

FIG. 12 shows a perspective view of an XY stage as an example of a known positioning device. A positioning device of this type is disclosed in, for example, Japanese Unexamined Patent Application Publication No. 8-229759.

In FIG. 12, reference numeral 42 denotes a base which supports a stage device and includes a reference surface 43, and reference numeral 38 denotes a fixed Y guide which is fixed to the base 42 and whose side surface serves as a reference surface. In addition, reference numeral 37 denotes a Y stage which serves as a moving body. The Y stage 37 is guided by the fixed Y guide 38 and is moved in a Y direction by Y linear motors 41 disposed at both ends thereof, each Y linear motor 41 including a fixed member 39 and a movable member 40. Reference numeral 32 denotes an X stage which includes movable members (not shown) of X linear motors. The X stage 32 is guided by an X guide 33 provided on the Y stage 37 and receives a thrust from fixed members 34 of the X linear motors which are also provided on the Y stage 37.

As shown in FIG. 12, a top plate 31 of the X stage 32 has a flat shape, and an X-direction mirror 45 and a Y-direction mirror 46 used for position measurement in the X and Y directions, respectively, are disposed on the top plate 31. The position measurement is performed by irradiating the mirrors with a laser beam and detecting the reflected light.

When a θZT driving mechanism shown in FIG. 16 is installed in this stage device, movements in a Z direction, which is a direction parallel to, for example, an optical axis of an exposure system, and in rotational directions around the X, Y, and Z axes ($\theta_x$, $\theta_y$, $\theta_z$) are also possible.

The upper portion of the X stage 32 shown in FIG. 12 corresponds to a base plate 151 shown in FIG. 16. A cylindrical fixed member 202 is provided on the base plate 151, and a porous pad 207 attached to the fixed member 202 retains an internal surface of a guiding member 203 without contacting it. The guiding member 203 is formed integrally with a top plate 204, which corresponds to the top plate 31 used for supporting a wafer and a wafer chuck (not shown). The base plate 151 can be rotated around the central axis thereof by a θ linear motor 216, and can be reciprocated in the vertical direction in FIG. 16 by Z linear motors 215 which are arranged along the circumferential direction at constant intervals.

FIG. 13 is a block diagram for each degree of freedom in the known positioning apparatus. Reference numeral 57 denotes mechanical characteristics Go of the positioning apparatus. According to the mechanical characteristics Go, a displacement x is output when a force f is input. Reference numeral 58 denotes controller characteristics Gc including characteristics of a proportional-integral-differential (PID) controller, amplifier characteristics, and stabilization filters. According to the controller characteristics Gc, a predetermined force f is output when the difference obtained by subtracting the displacement x from a desired position xr is input. For example, in position control in the X and Y directions, the output of a laser interferometer is used to determine the displacement x. The performance of the positioning apparatus is determined by how quickly and accurately the desired position can be tracked in each degree of freedom.

FIG. 14 is a diagram showing gain/phase characteristics of the control system of the known positioning apparatus. The gain/phase characteristics shown in FIG. 14 are the combination of the mechanical characteristics Go and the controller characteristics Gc shown in FIG. 13, and are called loop transfer characteristics. In order to obtain high-speed, high-accuracy tracking performance, the gain characteristics of the positioning apparatus are preferably made as high as possible. However, the mechanical characteristics Go include various natural frequencies, and the plate-shaped stage component 31 used in the known positioning apparatus may have a natural frequency with a high peak (weak damping) in a low-frequency region (from 300 Hz).

When vibration of the stage components occurs, the mirrors mounted on the stage for position measurement also vibrate and the positioning accuracy is reduced.

In addition, since oscillation occurs at the natural frequency when the gain is too high, the gain characteristics of the control system are limited. In FIG. 14, the zero-crossing frequency, which serves as an index of the gain level, is approximately 40 Hz.

Accordingly, it is necessary to suppress the peak by using stabilization filters such as low-pass filters and notch filters. Alternatively, the system is designed such that the natural frequency is increased to a high-frequency region.

In Japanese Unexamined Patent Application Publication No. 11-142555, for example, a stage component having a hollow structure is disclosed. With reference to FIG. 15, reference numeral 411 denotes a top plate unit included in an X stage. The top plate unit 411 is formed of ceramic and has a hollow structure as shown in the figure. This hollow structure 421 is constructed of two or more ceramic members and has an injection hole 431 at the bottom thereof. After the two or more members are baked, they are bonded together by a resintering process. In the resintering process, the members are generally bonded together by glass bonding using an alumina-based material having a coefficient of thermal expansion which is close to that of the members. However, when a material having a small coefficient of thermal expansion is used in order to suppress the thermal deformation of the top plate unit 411, there is the risk that sufficient bonding strength cannot be obtained. In addition, when an adhesive is used for bonding the members together, there is the risk that sufficient adhesive strength and adhesive reliability cannot be obtained.

In the above-described example, in order to move the top plate supporting the substrate, such as a wafer, to a predetermined position in the XY plane, the base plate is moved in the X and Y directions by the XY stage unit while the position of the top plate in the XY plane is determined by laser interferometers. In addition, the top plate receives a driving force from the base plate through radial air bearings. The top plate thus moves to the predetermined position. At this time, the top plate and the base plate preferably move together. However, in actuality, the driving force is applied to the top plate with a phase lag with respect to the movement of the base plate in correspondence with the compression of the air in the radial air bearings.

In order to prevent this, the radial air bearings may be omitted and Lorentz force actuators (linear motors) used in the θZT driving mechanism may also be used for fine movement in the X and Y directions. However, in such a case, it is extremely difficult for the Lorentz force actuators (linear motors) to generate enough force to hold the weight of the top plate, the wafer and the wafer chuck mounted on the top plate as well as to accelerate them because of restrictions on the size of the motors and heat emitted from the motors.

In addition, in the positioning apparatus of the known art such as the XY stage unit disclosed in the Japanese Unexamined Patent Application Publication No. 8-229759, because the top plate 204 is formed as a solid plate, the natural frequency thereof cannot be increased. In addition, when the hollow structure 42 disclosed in the Japanese Unexamined Patent Application Publication No. 11-142555 is used, the hollow structure cannot be formed if there is a difference in the coefficient of thermal expansion between the ceramic bonding material and the material of the hollow structure. Accordingly, materials having small coefficients of thermal expansion cannot be used. In addition, when an adhesive is used, differences occur between components even when they are formed in the same shape, and the natural frequency of the combined unit cannot be as high as a calculated or theoretical value because of differences between adhesion conditions.

In addition, when a material having a small coefficient of thermal expansion is used, since the top plate is formed as a solid plate, the thickness of the top plate is increased in order to ensure sufficient rigidity. Thus, the weight of the top plate is considerably increased relative to the increase in rigidity. Accordingly, the load placed on the above-described linear motors for acceleration is increased, and a current necessary to hold this acceleration is also increased. In addition, heat emitted from the linear motors increases proportionally to the square of the current. This degrades the environment around the wafer, and a problem occurs in that the alignment accuracy and stage accuracy are adversely affected and productivity is reduced when high-speed micromachining of semiconductor devices is required.

SUMMARY OF THE INVENTION

The present invention provides a positioning apparatus including a movable body having excellent controllability, and which can be positioned at high speed and with high accuracy.

These advantages can be obtained according to one aspect of the present invention, in which a positioning apparatus which moves an object comprises a first plate unit that retains the object and a second plate unit that retains the first plate unit. The second unit is composed of a ceramic material and comprises a hollow structure having a hollow section, the hollow structure including a rib and holes that provide a connection between an interior and an exterior of the hollow section.

For example, according to the present invention, a positioning apparatus which moves an object includes a first plate unit (wafer chuck) that retains the object and a second plate unit (top plate unit) that retains the first plate unit and comprises at least one of a low thermal expansion material having a coefficient of thermal expansion of $1.0e^{-6}$ (1/° C.) or less, an inorganic fiber composite, and a SiC composite containing SiC and Si. The second plate unit comprises a hollow structure having a hollow section, the hollow structure including a rib to increase the natural frequency of the second plate unit with respect to the torsional mode. In addition, the second plate unit has holes for providing connection between the interior and exterior of the hollow section.

In another aspect of the invention, the second plate unit includes an upper plate, a lower plate, and a plurality of side plates surrounding the upper plate and the lower plate. The rib extends from one of the plurality of side plates at an intermediate region thereof to an intermediate region of another of the plurality of side plates.

In yet another aspect of the invention, a positioning apparatus which moves an object comprises a first plate unit that retains the object and a second plate unit that retains the first plate unit. The second plate unit is composed of a ceramic material and comprises a rib and a plurality of side plates on a periphery of the second plate unit. The rib extends from an intermediate region of one of the plurality of side plates to an intermediate region of another of the plurality of side plates, with the intermediate region of each side plate of the plurality of side plates being separated from an end of the each side plate.

In still another aspect of the present invention, a positioning apparatus which moves an object comprises a first plate unit that retains the object and a second plate unit that retains the first plate unit. The second plate unit is composed of a ceramic material and comprises a hollow structure having a hollow section, with the hollow structure including a rib and a plurality of side plates on a periphery of the second plate unit. The rib extends from an intermediate region of one of the plurality of side plates to an intermediate region of another of the plurality of side plates, the intermediate regions of each side plate of the plurality of side plates being separated from an end of each side plate.

In another aspect of the invention, the second plate unit includes an upper plate and a lower plate that are formed integrally with the rib, and holes for providing a connection between the interior and exterior of the hollow structure. In addition, the rib comprises a first rib unit having a rectangular shape in cross section and a second rib unit having a diamond shape in cross section. The first and second rib units are alternately disposed inside each other and bonded to each other.

When the positioning apparatus serves as a substrate-moving stage in a semiconductor exposure apparatus, the object may be either a photosensitive substrate or an original plate having an exposure pattern. Preferably, the wafer chuck, the top plate unit, and optical mirrors used for determining a relative position of the object such as a wafer are all composed of the same material having a hollow structure.

The top plate unit may have a short-stroke electromagnetic actuator unit that moves the object with six degrees of freedom to a predetermined position and a mechanism for supporting the top plate unit against gravity.

Preferably, the positioning apparatus according to the present invention further includes a long-stroke electromagnetic actuator unit that moves the top plate unit in X and Y directions in long strokes and an X stage that is moved by the long-stroke electromagnetic actuator unit and supports both of the short-stroke electromagnetic actuator unit and the mechanism for supporting the top plate unit against gravity.

Preferably, the short-stroke electromagnetic actuator unit includes at least three Lorentz force actuators for moving the object in the horizontal direction and the yaw direction to the predetermined position. In addition, preferably, the short-stroke electromagnetic actuator unit further includes electromagnetic actuators which modulate an acceleration for moving the object in the horizontal direction. In order to reduce the distance between the center of gravity of the top plate unit and a power point of the Lorentz force actuators and the electromagnetic actuators, the top plate unit to which the electromagnetic actuators are attached preferably includes a hollow structure having an open area at the bottom side thereof. In addition, coils and magnets of the Lorentz force actuators are arranged such that a thrust constant is within several percent of a maximum thrust constant when the object is at a position where an exposure process is performed.

In addition, preferably, the positioning apparatus further includes at least three Lorentz force actuators for controlling the position of the object in a vertical direction, a pitch-direction, and a roll-direction, the Lorentz force actuators having sufficient strokes for moving the top plate unit, which conveys the object. Furthermore, preferably, the positioning apparatus further includes a weight-compensation mechanism, which includes magnets for generating a repulsive force or an attractive force, a coil spring, etc., and generates a force corresponding to a total weight of the top plate unit, the wafer and the wafer chuck attached to the top plate unit, and perhaps movable members of the Lorentz force actuators, electromagnetic actuators, and the weight-compensation mechanism, in order to support the total weight against gravity.

In order to prevent deformation of the top plate unit, the mirrors, the wafer, etc., due to heat emitted from the actuators, coils of the actuators may be attached to the X stage. A pipe or a wire for feeding electricity, gas, or liquid from the upper plate of the X stage to the wafer chuck, etc., mounted on the top plate unit may be disposed at either a central area or a peripheral area of the top plate unit. In such a case, the vibration transmissibility due to the pipe or the wire is reduced.

Preferably, the upper plate of the X stage has at least three supporting rods that temporarily support the object when the object is moved from a conveyor hand to the wafer chuck. The supporting rods extend through the wafer chuck and the top plate unit or second plate unit, and when the top plate unit is moved in the vertical direction by the Lorentz force actuators and the weight-compensation mechanism, the supporting rods project from the top surface of the wafer and temporarily support the object.

In addition, in a finishing process of a surface of the second plate unit, particles may be injected into the hollow section of the hollow structure through the holes for providing connection between the interior and exterior of the hollow section. When the weight of the hollow section filled with the particles is made the same as the weight obtained if the hollow section is filled with the same material as the material of the second plate unit, a constant surface pressure is applied during a lapping process, so that the surface can be processed with high accuracy. In addition, a process of forming the mirror surfaces for determining the relative position of the object may be performed after mechanically fixing a third plate unit to the second plate unit.

As described above, according to the present invention, the top plate unit, which serves as a movable body in the positioning apparatus, is composed of at least one of a low thermal expansion material having a coefficient of thermal expansion of $1.0e^{-6}$ (1/° C.) or less, an inorganic fiber composite, and a SiC composite containing SiC and Si, in an integral, hollow structure. Accordingly, a light, strong, rigid top plate unit that is not easily deformed by heat is obtained. In addition, due to the electromagnetic couplings and the Lorentz force actuators of the top plate unit, a positioning apparatus having a high controllability is obtained. Furthermore, when a lapping process is performed after the particles are injected into the hollow section, a constant surface pressure is applied, so that the surface can be processed with high accuracy.

Further features and advantages of the present invention will become apparent from the following description of the preferred embodiments with reference to the attached drawings.

DESCRIPTION OF THE PREFERRED EMBODIMENTS

Positioning apparatuses according to embodiments of the present invention will be described in detail below with reference to the accompanying drawings, considering a case in which a moved object is a wafer which serves as a photosensitive substrate as an example. The present invention may also be applied in a case in which the moved object is an original plate having an exposure pattern.

First Embodiment

Figure 1:
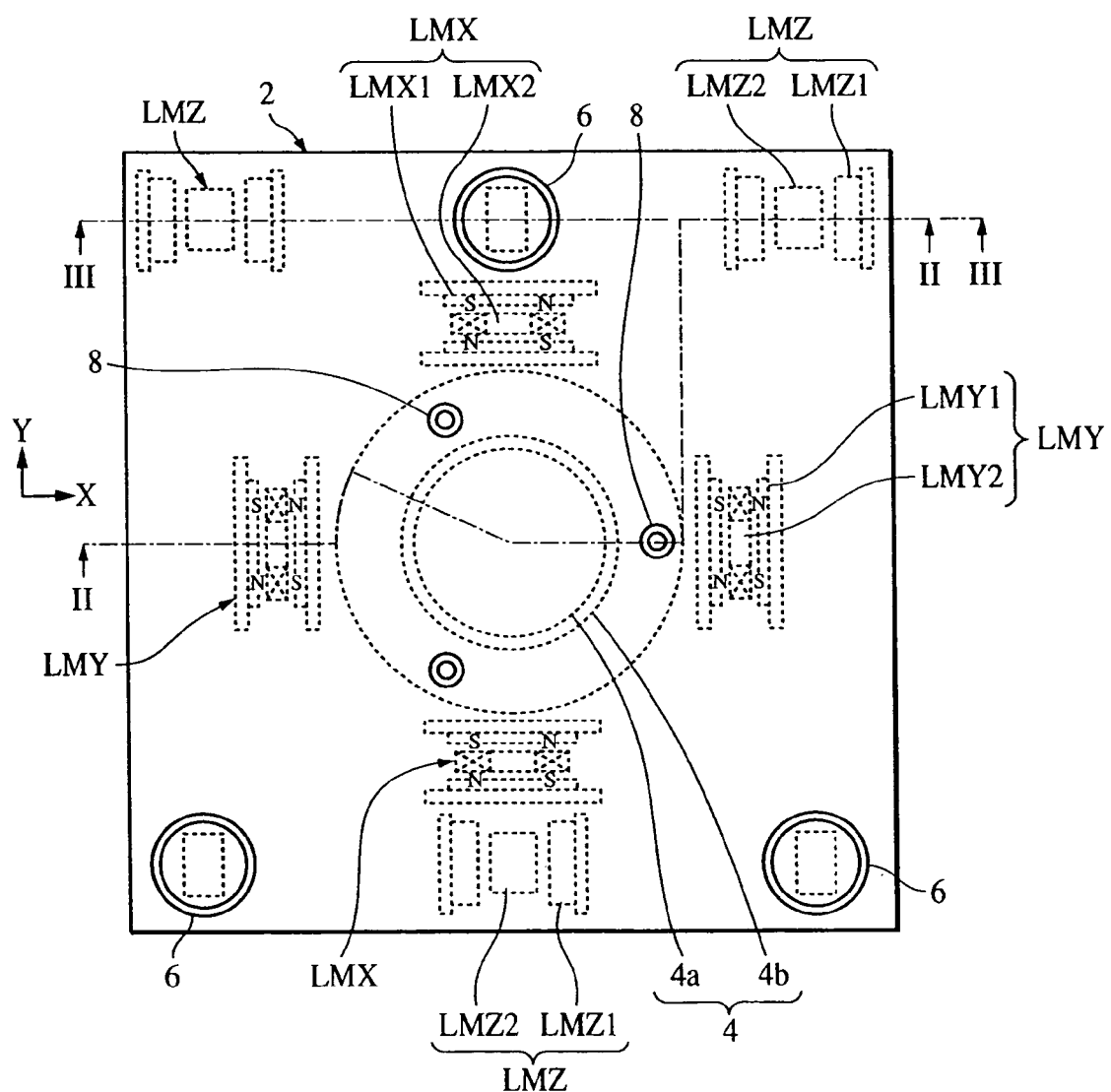
FIG. 1 is a plan view of a positioning apparatus according to a first embodiment of the present invention.
Figure 2:
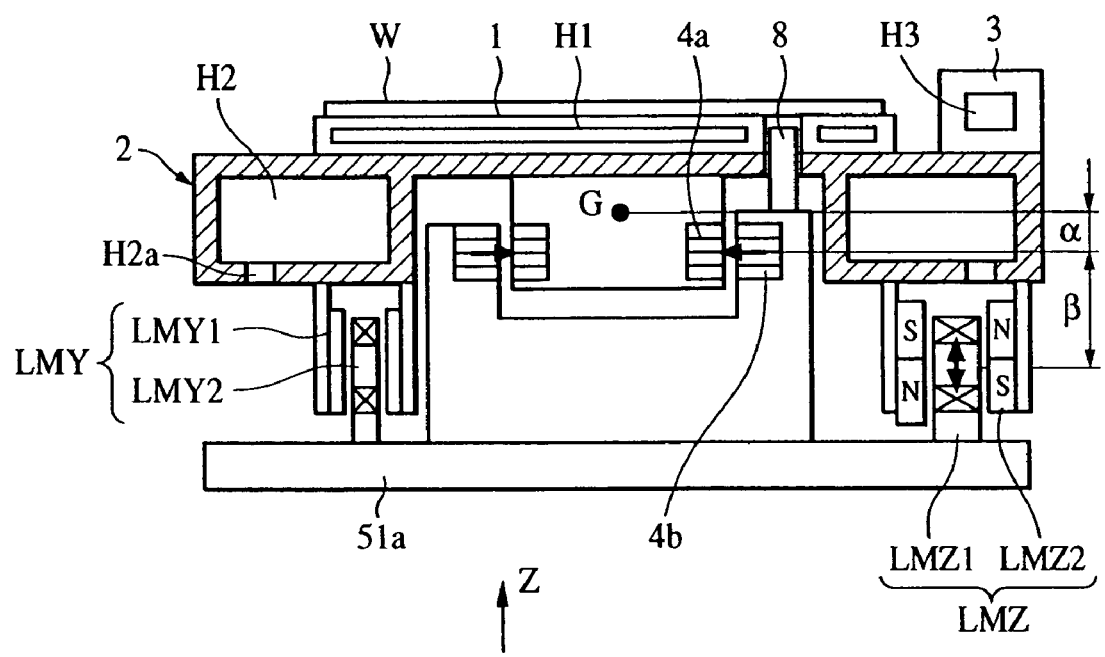
FIG. 2 is a sectional view of FIG. 1 cut along line II—II.
Figure 3:
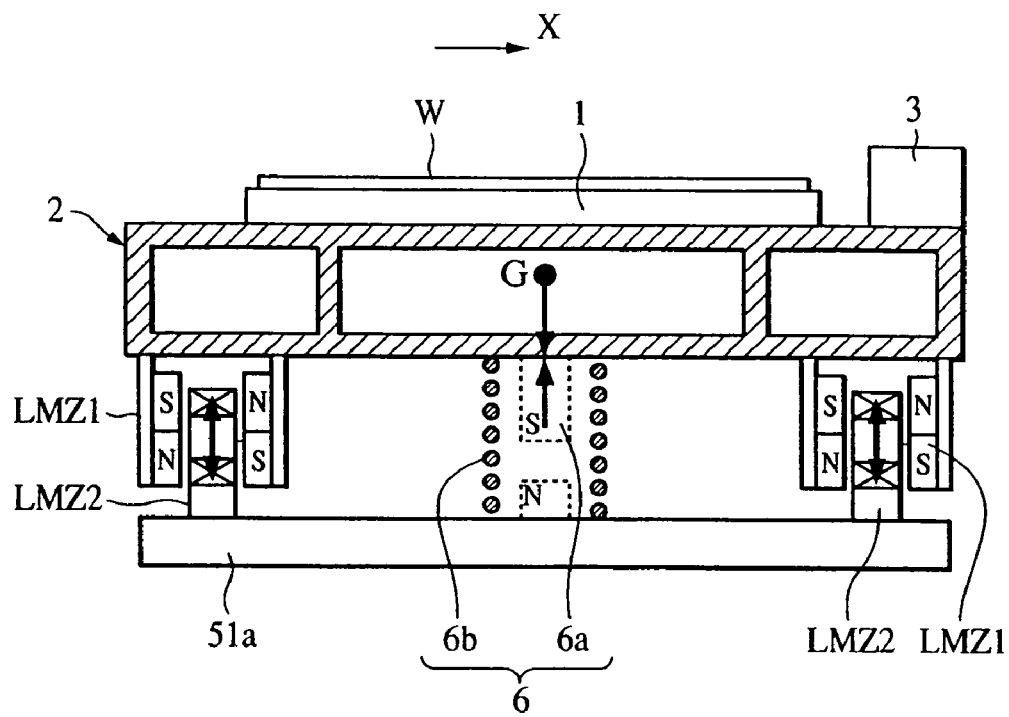
FIG. 3 is a sectional view of FIG. 1 cut along line III—III.

FIG. 1 is a schematic top view of a top plate included in a positioning apparatus according to a first embodiment of the present invention and peripheral regions thereof. FIG. 2 is a sectional view of FIG. 1 cut along line II—II and FIG. 3 is a sectional view of FIG. 1 cut along line III—III. The positioning apparatus includes a wafer chuck 1 which serves as a first plate unit, a hollow plate unit 2 which serves as a second plate unit and retains the chuck 1, a mirror 3, electromagnetic couplings 4, weight-compensation mechanisms 6, supporting rods 8, and X-direction fine-movement linear motors LMX, Y-direction fine-movement linear motors LMY, and Z-direction fine-movement linear motors LMZ used for finely adjusting the position of the hollow plate unit 2, etc. The above-described components are disposed on an upper plate 51a of an X stage.

The hollow plate unit 2 shown in the figures is constructed by first forming an integral, hollow structure, and then sintering it. The hollow plate unit 2 may be formed by using inorganic fiber composites or SiC composites containing SiC and Si, and the entire body thereof is formed of a single material by the sintering process. Since the hollow structure is formed without bonding two or more dissimilar materials and without using an adhesive or glass bonding in the resintering process, reduction in rigidity at the bonded portions does not occur as in the known art.

In the case in which a low thermal expansion material having a small coefficient of thermal expansion such as $1.0e^{-6}$ (1/° C.) or less or SiC is used, the co-sintering process for obtaining the hollow structure cannot be performed. Accordingly, two or more members must be bonded together. Also in this case, when the members are bonded together by metal bonding instead of using an adhesive or glass bonding, the difference in the coefficient of linear expansion can be compensated for, so that reduction in rigidity at bonded portions does not occur as in the known art. Thus, an integral, hollow structure formed of a single material is obtained.

Figure 5A:
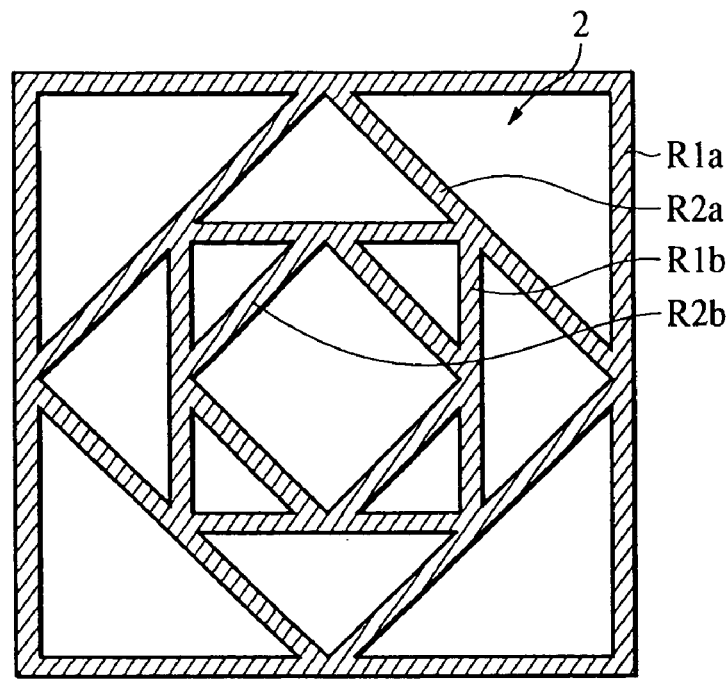
FIG. 5A is a sectional view showing an example of a rib structure of a hollow plate unit included in the positioning apparatus according to the present invention.
Figure 5B:
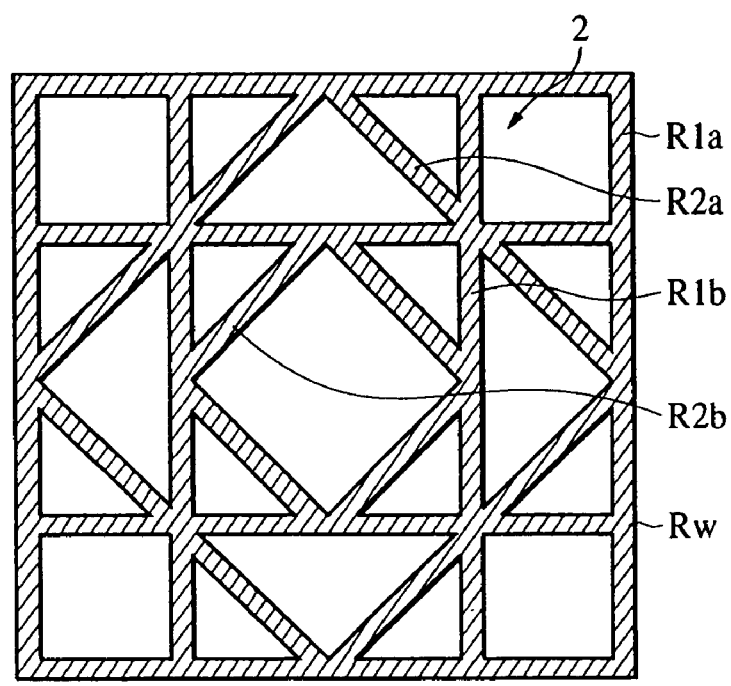
FIG. 5B is a sectional view showing a modification of the rib structure shown in FIG. 5A.
Figure 6:
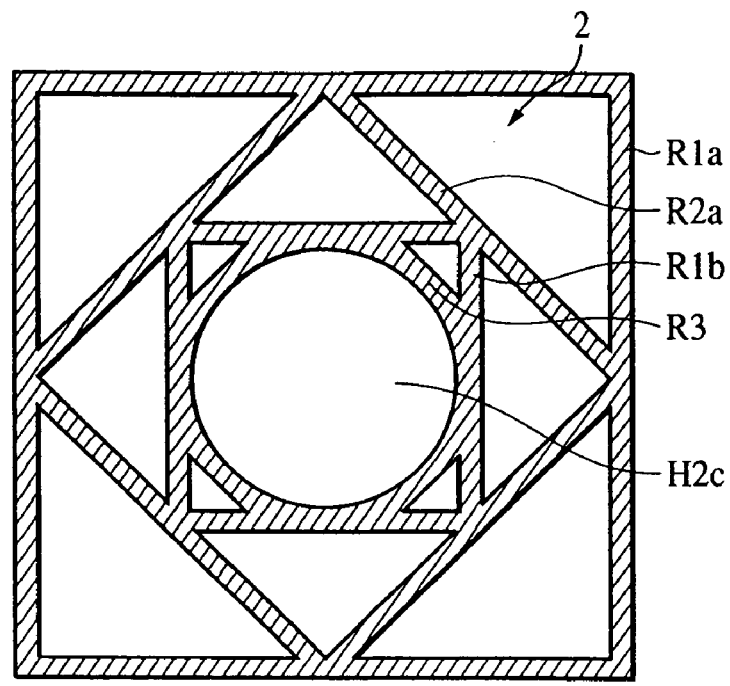
FIG. 6 is a sectional view showing another example of the rib structure of the hollow plate unit included in the positioning apparatus according to the present invention.

In addition, in order to ensure the rigidity, the hollow plate unit 2 has a rib structure similar to those shown in FIGS. 5A, 5B, and 6, and through holes H2a, shown in FIG. 2, are formed for allowing ambient gas to pass therethrough and providing connection between the interior and exterior of a hollow section H2 having the rib structure. The external environment may be, for example, the atmosphere, a $N_2$ environment, a He environment, a vacuum environment, etc. Although the hollow structure is manufactured in an inactive-gas environment, this environment is different from those in which the hollow plate unit 2 is mounted on the stage or in which the positioning apparatus is stored. The through holes H2a are formed in order to avoid a situation that the residual gas captured inside the hollow plate unit 2 leaks into the external environment and degrades the environment around the stage, which makes it difficult to increase the degree of vacuum.

The wafer chuck 1 for receiving a wafer W, which is a photosensitive substrate, is disposed on the top surface of the hollow plate unit 2. The chuck 1 is fixed to the hollow plate unit 2 by air suction or a mechanical clamp (not shown), and the wafer W is retained on the chuck 1 by air suction or an electrostatic force (not shown).

In addition, the mirror 3 is provided for determining the relative position of the wafer W. Although only one mirror 3 is shown in FIG. 2, a plurality of mirrors are provided in actuality in order to determine the position in six degrees of freedom. Although the top surface of the mirror 3 should be viewed from the top, it is omitted in FIG. 1. The mirror 3 is fixed to the hollow plate unit 2 by, for example, a method disclosed in Japanese Unexamined Patent Application Publication No. 5-19157.

The chuck 1 and the mirror 3 are formed of the same material as the hollow plate unit 2, so that they have the same coefficient of thermal expansion and the same coefficient of thermal conductivity. Accordingly, even when the temperature of the hollow plate unit 2 varies due to heat caused in an exposure process or heat emitted from actuators, deformation due to the difference in coefficient of thermal expansion does not occur between the hollow plate unit 2 and the mirror 3 or between the hollow plate unit 2 and the chuck 1. In addition, the chuck 1 and the mirror 3 have hollow structures and include hollow sections H1 and H3, respectively, so that the weights thereof are reduced and the rigidities thereof are increased. When the weights of the chuck 1 and the mirror 3 are reduced, the natural frequency of the entire movable body including the hollow plate unit 2 increases.

Actuators using an electromagnetic force for moving the wafer W to a predetermined position with six degrees of freedom are disposed under the hollow plate unit 2. More specifically, two types of actuators using the electromagnetic force are provided: the electromagnetic couplings 4 for the acceleration in the X and Y directions and fine-movement linear motors LM which serve as Lorentz force actuators used for the position control in six degrees of freedom. The above-described actuators have short strokes, and are mounted on the upper plate 51a of an X stage 51 shown in FIG. 17, which has a long stroke.

Figure 17:
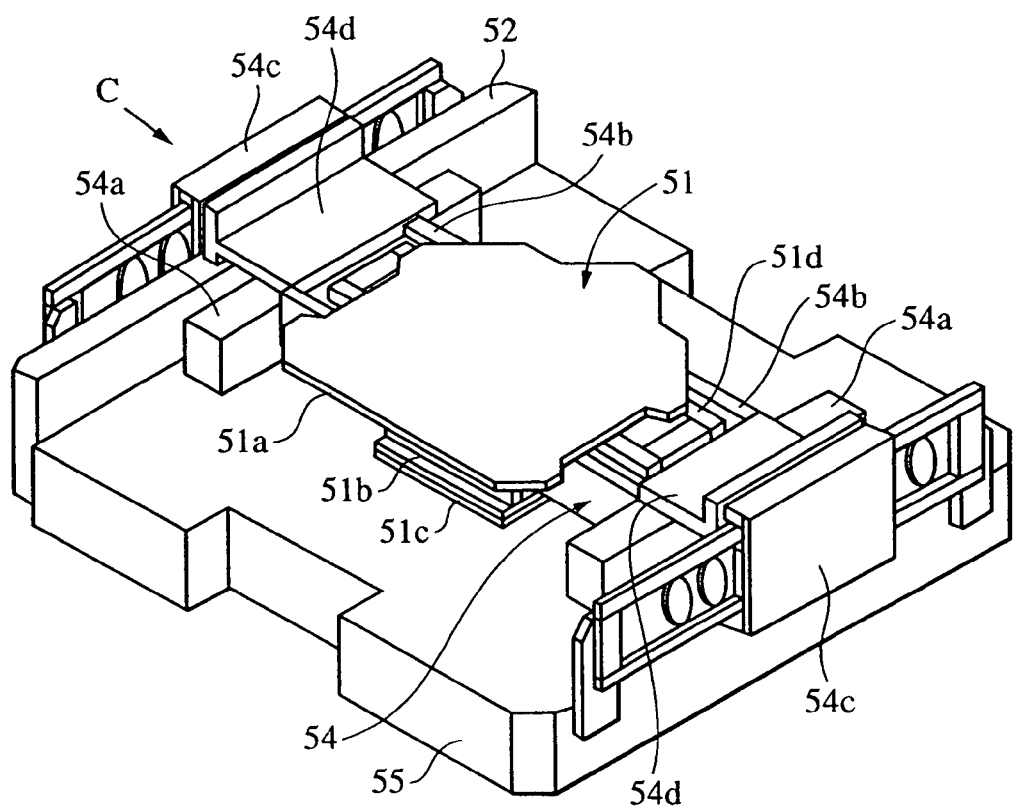
FIG. 17 is a perspective view of a long-stroke X stage.

Next, a Y stage 54 and the X stage 51, which serve as a long-stroke stage unit, will be described below with reference to FIG. 17. The Y stage 54 is levitated above a base 55 by supplying air to hydrostatic air bearings (not shown) disposed under Y-stage guides 54a. When air is supplied to hydrostatic air bearings (not shown) at a fixed guide 52 placed at one side of the base 55 and at one of the Y stage guides 54a, the Y stage 54 is moved in the Y direction by two drive actuators 54c disposed at both sides of the Y stage 54 while being guided in the horizontal direction along the fixed guide 52. In addition, similarly to the Y stage 54, the X stage 51 is also levitated above the base 55 by supplying air to hydrostatic air bearings (not shown) disposed under an X stage base 51c. When air is supplied to hydrostatic air bearings (not shown) at a side surface 54b of the Y stage 54 and at an X stage guide 51b, the X stage 51 is moved in the X direction by drive actuators 51d while being guided in the horizontal direction along the side surface 54b. The X stage 51 and the Y stage 54 are maintained at a predetermined orientation by a plurality of pressurizing magnet units. Laser interferometers (not shown) are provided on the long-stroke stage unit. Optical mirrors similar to those disposed on the top plate of the known art may be disposed on the top surface of the X stage 51 for the laser interferometers. Alternatively, an optical mirror may be provided on each of flat portions 54d of the Y stage 54 for the Y direction, and the position of the X stage 51 may be determined by determining the position of the optical mirror disposed on the X stage 51 relative to the Y stage 54. This long-stroke stage unit may have the same construction as the stage device disclosed in the Japanese Unexamined Patent Application Publication No. 8-229759 except for the laser interferometers used for controlling the long-stroke stage unit.

According to a known technique, in final position control in the X and Y directions, the wafer W is moved by the drive actuators 54c and 51d having long strokes via the radial air bearings. In the present embodiment, the final position control in the X and Y directions is performed by using the above-described fine-movement linear motors LMX and LMY, which are Lorentz force actuators disposed under the hollow plate unit 2. Accordingly, a long-stroke stage unit having a relatively low control performance may also be used, so that the component cost and adjustment cost can be reduced. In addition, it is not necessary to use the Lorentz force actuators as the long-stroke actuators, and other types of linear motors in which more importance is placed on heat emission or thrust may also be used.

The electromagnetic couplings 4 transmit an acceleration generated by the long-stroke actuators to the fine-movement unit including the hollow plate unit 2. Since a single electromagnetic coupling generates only an attractive force, two electromagnetic couplings 4 are disposed such that they oppose each other in the X direction, as shown in FIG. 2. In addition, although not shown in the figure, two electromagnetic couplings 4 are disposed such that they oppose each other in the Y direction, that is, in the direction perpendicular to the page in FIG. 2. Each of the electromagnetic couplings 4 includes a fixed member 4b attached to the upper plate 51a of the X stage at the central region thereof and a movable member 4a attached to the hollow plate unit 2. From the viewpoint of heat emission and the mounting process, coils (not shown) of the electromagnetic couplings 4 are disposed on the fixed members 4b. The movable members 4a and the fixed members 4b are both formed by using electromagnetic steel plates, and laminated steel plates of the fixed members 4b have an E shape or a U shape so that the coils can be wound around it. In each of the electromagnetic couplings 4, a sufficient gap is formed between the movable member 4a and the fixed member 4b. The amount of this gap is determined on the basis of the surface-processing accuracy and the fabrication accuracy of the electromagnetic couplings 4, a stroke required for the movement in six degrees of freedom for position control or wafer alignment, and the difference between the position of the X stage 51 controlled by the long-stroke actuators and the position of the fine-movement unit during acceleration (control residual of the long-stroke unit). In addition, the opposing surfaces of the electromagnetic couplings 4 are formed along cylindrical surfaces so that they do not interfere with each other when the fine-movement unit moves the wafer W in the rotational direction around the Z axis.

In the unit including the above-described four electromagnetic couplings 4, all of the arc surfaces facing each other have the same center. In addition, from the viewpoint of processing accuracy, the radii thereof are preferably the same. Furthermore, the central point of the arc surfaces in the XY plane is preferably at the same position as the center of gravity G of the fine-movement unit including the hollow plate unit 2.

As described above, the fine-movement linear motors LM, which are the Lorentz force actuators, are disposed under the hollow plate unit 2 for the position control in six degrees of freedom. The fine-movement linear motors LMX and LMY used for fine movement in the X and Y directions are disposed at the periphery of the electromagnetic couplings 4. Two Y-direction fine-movement linear motors LMY are disposed along the X axis, and two X-direction fine-movement linear motors LMX are disposed along the Y direction. Yaw-direction control is performed by using either one of the Y-direction fine-movement linear motors LMY and the X-direction fine-movement linear motors LMX. As another arrangement of the fine-movement linear motors LM, either one of the X-direction fine-movement linear motors LMX and the Y-direction fine-movement linear motors LMY may be reduced to one and be disposed at the center of gravity of the fine-movement unit. In the X-direction and Y-direction fine-movement linear motors LMX and LMY, magnets and yokes are disposed on the movable members LMX1 and LMY1, and coils which emit heat are disposed on the fixed members LMX2 and LMY2 from the viewpoint of heat emission and the mounting process.

In order to control the movement in the Z direction, pitch direction, and roll direction, three Z-direction fine-movement linear motors LMZ are placed under the hollow plate unit 2, as shown in FIG. 1. FIG. 3 is a sectional view of FIG. 1 cut along line III—III. Similar to the X-direction and Y-direction fine-movement linear motors LMX and LMY, the Z-direction fine-movement linear motors LMZ, magnets and yokes are disposed on the movable members LMZ1 and coils which emit heat are disposed on the fixed members LMZ2 from the view of heat emission and the mounting process.

In addition, the weight-compensation mechanisms 6 are disposed under the hollow plate unit 2. As shown in FIG. 3, the weight-compensation mechanisms 6 are constructed such that the total force generated by the weight-compensation mechanisms 6 is approximately the same as the weight of the fine-movement unit. Although a residual force remains since the total force generated by the weight-compensation mechanisms 6 varies in accordance with the vertical position of the hollow plate unit 2, it is completely eliminated by the Z-direction fine-movement linear motors LMZ. The Z-direction fine-movement linear motors LMZ must continuously generate a large thrust because of this residual force, and the total force generated by the weight-compensation mechanisms 6 is adjusted such that the environment around the hollow plate unit 2 is not degraded due to heat emitted from the fine-movement linear motors LM. In order to reduce the variation in the generated force, each of the weight-compensation mechanisms 6 use both a pair of attracting magnets 6a and a compression spring 6b. Alternatively, a bellowphragm or a pair of repelling magnets which produces a similar effect may also be used.

When the weight-compensation mechanisms 6 are disposed coaxially with the Z-direction fine-movement linear motors LMZ, the hollow plate unit 2 does not receive the residual force of the weight-compensation mechanism 6 which cannot be removed. Accordingly, they are preferably disposed coaxially with the Z-direction fine-movement linear motors LMZ.

Figure 4:
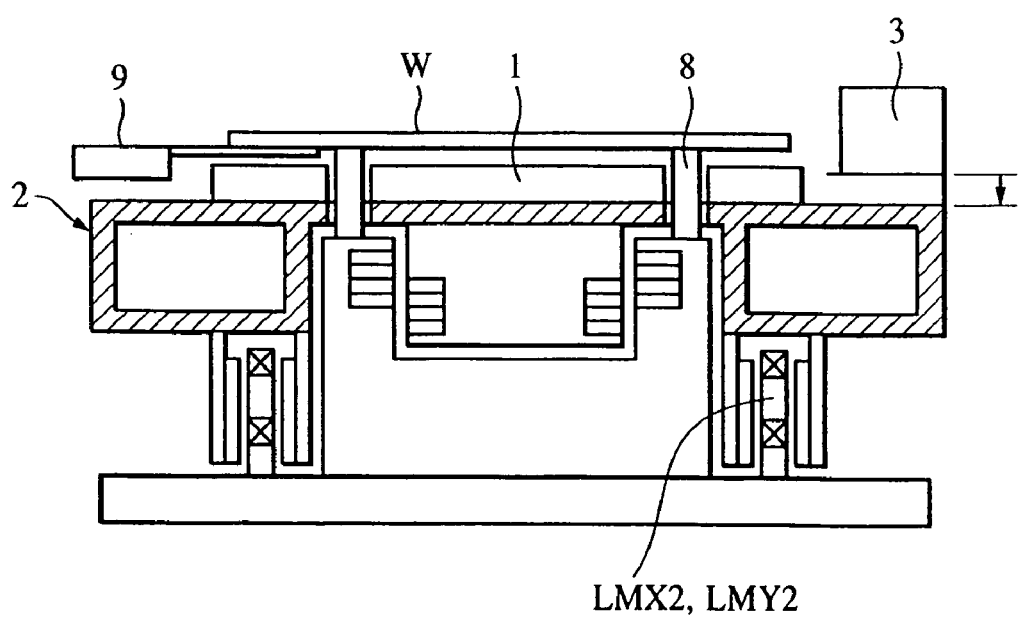
FIG. 4 is a sectional view of the positioning apparatus according to the first embodiment cut along a center line, showing a manner in which the positioning apparatus operates.

Three supporting rods 8 used for temporarily supporting the wafer W when it is exchanged are provided at the same side as the fixed members 4b of the electromagnetic couplings 4. While the wafer W is being retained on the chuck 1 and subjected to the exposure process, the top surfaces of the supporting rods 8 are positioned below the bottom surface of the wafer W. The supporting rods 8 themselves do not have a function to move vertically, and when the entire body of the hollow plate unit 2 is moved downward by the Z-direction fine-movement linear motor LMZ, the supporting rods 8 project from the top surface of the chuck 1, as shown in FIG. 4. Accordingly, the supporting rods 8 retain the wafer W at the bottom surface thereof. The entire body of the hollow plate unit 2 is moved downward until the gap between the bottom surface of the wafer W and the top surface of the chuck 1 is sufficiently increased such that a conveyor hand 9 used for conveying the wafer W can be inserted therein. Accordingly, the wafer W can be exchanged by using the conveyor hand 9.

The position of the mirror 3 in the vertical direction is determined such that the measurement using the laser interferometer can be performed even when the hollow plate unit 2 is moved downward from a position where the exposure process is performed (hereinafter referred to as a exposure position) in order to exchange the wafer W, etc.

As shown in FIG. 4, the magnets and the coils of the X-direction, Y-direction, and Z-direction fine-movement linear motors LMX, LMY, and LMZ are arranged such that the thrust can be generated even when the hollow plate unit 2 is at a position higher than the exposure position for cleaning the chuck 1 or at a position lower than the exposure position for exchanging the wafer W. Since the wafer W is exchanged in a short time and only a small amount of heat is emitted, it is not necessary to generate a thrust as high as that generated when the hollow plate unit 2 is at the exposure position. Thus, the size of the fine-movement linear motors LM is preferably reduced by reducing the thrust constant by approximately 10% compared to when the hollow plate unit 2 is at the exposure position. When large fine-movement linear motors LM are used to obtain the same thrust at every position, the size of the magnets is increased and the weight of the fine-movement unit is increased accordingly. Accordingly, load placed on the electromagnetic couplings 4 during acceleration increases and heat is emitted from the electromagnetic couplings 4, which degrades the surrounding environment. In addition, a problem occurs in that the temperature of the hollow plate unit 2 increases due to the heat generated and the distance between the wafer W and the mirror 3 varies. In addition, load placed on the large-stroke linear motors also increases. Furthermore, when the height of the fine-movement linear motors LM in the Z direction increases along with the increase in size thereof, the distance between the center of gravity G of the fine-movement unit and the driving point (power point) of the long-stroke linear motors also increases. Accordingly, a moment is applied to the X stage 51, and load placed on the hydrostatic air bearings disposed under the bottom surface of the X stage 51 increases. Since the load placed on the hydrostatic air bearings per unit of area preferably is maintained constant, the area of the bottom surface of the X stage 51 increases. When the size of the X stage 51 increases, the X linear motors used for transferring the X stage 51 and the Y linear motors used for transferring the X linear motors receive larger loads. In this manner, loads are successively increased from the wafer side toward the base side. Therefore, in the present embodiment, it is important to reduce the size of the fine-movement linear motors LM. As shown in FIG. 2, the fine-movement linear motors LM are constructed such that the coils and the magnets are positioned asymmetrically (the centers thereof are not at the same position) at the exposure position, and the thrust constant is within several percent of the maximum thrust constant at the exposure position.

The reason why the thrust constant is set to within several percent of the maximum thrust constant and not to the maximum thrust constant is because if the reduction in thrust constant caused when the hollow plate unit 2 is moved downward for exchanging wafers exceeds 20%, the influence of heat cannot be ignored even though the exchanging process takes only a short time.

As shown in FIG. 2, in order to make the center of gravity of the fine-movement unit close to the power point of the electromagnetic couplings 4, the hollow plate unit 2 of the present embodiment includes an open area at the central region thereof. When the distance $\alpha$ is 10 mm, the weight of the hollow plate unit 2 is 10 kg, and the support span of the Z-direction fine-movement linear motors LMZ is 100 m, and the wafer W is moved at the acceleration of, for example, 1G, the Z-direction fine-movement linear motors LMZ must hold the force of 1 kgf due to the moment determined on the basis of the distance $\alpha$. In order to reduce heat emitted from the Z-direction fine-movement linear motors LMZ, the distance $\alpha$ between the center of gravity G of the fine-movement unit and the power point of the electromagnetic couplings 4 is preferably zero. On the contrary, when the electromagnetic couplings 4 are disposed on the same plane as the X-direction, Y direction, and Z-direction fine-movement linear motors LMX, LMY and LMZ, the force held by the Z-direction fine-movement linear motors LMZ increases proportionally to the distance $\alpha$, so that the size of the Z-direction fine-movement linear motors LMZ must be increased. Accordingly, the moving weight also increases, and it becomes difficult for the stage unit to function. In FIG. 2, the distance $\alpha$ is exaggerated in order to facilitate understanding.

Next, construction of the hollow plate unit 2 will be described below. The hollow plate unit 2 has a rib structure to increase strength and rigidity. In addition, the hollow plate unit 2 has through holes H2a for making the interior environment of the hollow cells formed by the ribs and the external environment the same.

In the control system of the positioning apparatus according to the present embodiment, in order to obtain high-speed, high-accuracy tracking performance, the gain characteristics of the positioning apparatus are preferably made as high as possible. For this reason, it is necessary to increase the natural frequency, which is one of the mechanical characteristics of the stage unit that have been limiting the gain characteristics in known techniques. In the hollow plate unit 2 according to the present embodiment, the natural frequency is considerably increased compared to that obtained by known techniques due to the rib structure and the hollow section, and the gain characteristics of the control system are improved. Recently, in scanning exposure apparatuses, for example, it has been required to increase the zero-crossing frequency of the stage unit itself in order to obtain a high degree of synchronization between the wafer and the reticle, such as within several nanometers. Accordingly, the zero-crossing frequency of the hollow plate unit 2 necessary to satisfy this requirement has been increased several times. By applying the present invention, the hollow plate unit 2 having a high natural frequency can be obtained.

Next, the rib structure will be explained. FIGS. 5A and 5B are sectional views showing examples of the rib structure of the hollow plate unit 2. In the case in which an open area is not formed at the central region, the hollow plate unit 2 may have the rib structures shown in FIGS. 5A and 5B.

Figure 18:
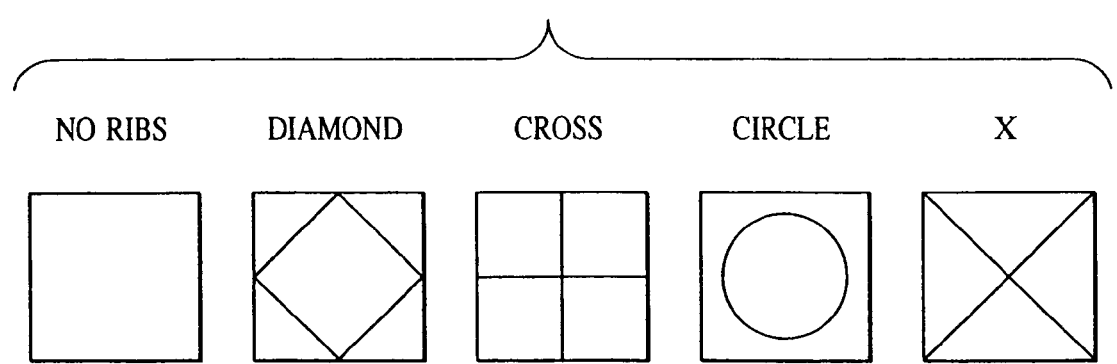
FIG. 18 is a diagram showing five patterns (no ribs, diamond-shaped, cross-shaped, circular, and X-shaped) of the rib structure of the hollow plate unit.

Rib structures having five patterns shown in FIG. 18 (no ribs, diamond-shaped, cross-shaped, circular, and X-shaped) have been evaluated by performing eigenvalue analysis. As a result, the first vibration mode is torsional, and the natural frequency increases in the order from the structure having high resistance to the torsional mode to the structure having low resistance to the torsional mode. In the above-described five patterns, the natural frequency increases in the order of no ribs, cross-shaped, circular, x-shaped, and diamond-shaped. Accordingly, in the rib structure according to the present invention, ribs arranged in the diamond pattern are more preferable than those arranged in the X-shaped pattern, which is commonly used when ribs are installed in a base.

The ribs are formed integrally with an upper plate and a lower plate of the hollow plate unit 2, and side plates are disposed around the upper plate and the lower plate. Each rib extends from one of the side plates at an intermediate region, which is separated from the corners where the side plate is connected to the adjacent side plates, to an intermediate region of an adjacent side plate.

FIGS. 5A and 5B show specific examples of the rib structure. In the rib structure shown in FIG. 5A, a rib unit R1 having a rectangular shape in cross section, the sides thereof extending along the X and Y fine movement directions, and a rib unit R2 having a diamond shape in cross section, the sides thereof extending at an angle of 45 degrees relative to the X and Y fine movement directions, are alternately arranged. More specifically, a rib unit R2a is disposed inside a rib unit R1a, a rib unit R1b is disposed inside the rib unit R2a, and a rib unit R2b is disposed inside the rib unit R1b. Due to this construction, a considerably high natural frequency is obtained.

The present embodiment is characterized in that the electromagnetic couplings 4 are disposed at the central region. A rib structure corresponding to this construction is shown in FIG. 6. In this rib structure, the inner circle forming an attachment hole H2c used for attaching the movable members 4a of the electromagnetic couplings 4 is sufficiently large so that the inner surface of the attachment hole H2c does not interfere with the exterior surface of a fixed unit on which the fixed members 4b of the electromagnetic couplings 4 are attached. The rib structure includes a rib unit R3 whose inner periphery has a circular shape and whose outer periphery has the shape of the combination of a diamond and a circle. The outer region of this rib unit R3 is formed similarly to FIG. 5A, where a rectangular rib unit and a diamond-shaped rib unit are alternately disposed. More specifically, a diamond-shaped rib unit R2a is disposed inside a rectangular rib unit R1a, and a rectangular rib unit R1b is disposed inside the diamond-shaped rib unit R2a.

FIG. 5B shows a modification of FIG. 5A. In FIG. 5A, the weight at the triangular portions at the four corners is reduced in order to increase the neutral frequency. However, in actuality, the weight of the mirror 3, etc., is placed thereon. In such a case, the neutral frequency can be effectively increased by forming ribs which extend from intermediate regions Rw of the side plates, at which resistance to torsion is small, rather than forming ribs which extend diagonally from the corners at which the side plates are connected to each other.

In the present embodiment, the thickness of the ribs is preferably set to approximately 5 mm according to calculations. Even when the thickness is increased to 10 mm, the natural frequency increases only by a small amount. In the case in which a SiC composite containing SiC and Si is used, the process of sintering each member of the hollow structure in advance is not performed. Accordingly, it is not necessary to increase the thickness of the ribs in order to obtain sufficient bonding areas or to maintain the strength of each member in the sintering process. In the present embodiment, the rib structure of the hollow plate unit 2 is formed before the final sintering process. Thus, there is an advantage in that the strength of the hollow plate unit before the sintering process is also ensured. Since it is not necessary to increase the thickness of the ribs which provide the bonding surfaces even though the natural frequency cannot be increased, as in the known art, the weight of the hollow plate unit 2 can be prevented from being increased more than necessary. Accordingly, the weight of the hollow plate unit 2 is reduced, and the load placed on the linear motors for acceleration is also reduced. In addition, the current required for generating a sufficient force to hold this acceleration is also reduced and heat emitted from the linear motors is considerably reduced. Accordingly, the adverse influence on the environment is reduced and the positioning accuracy is increased.

When an inorganic fiber composite is used, since the specific rigidity thereof is high, the weight is further reduced and the rigidity is further increased.

In addition, according to the known art, the top plate cannot be formed of a low thermal expansion material having a small coefficient of thermal expansion such as $1.0e^{-6}$ (1/° C.) or less if the low thermal expansion material is a cordierite-based material, since the Young's modulus thereof is low. However, according to the present invention, the hollow plate unit having the rib structure may also be formed of low thermal expansion materials.

In addition, similar effects can of course be obtained also when SiC having a high Young's modulus is used in order to obtain a higher rigidity than when SiC composites are used.

Second Embodiment

Figure 7:
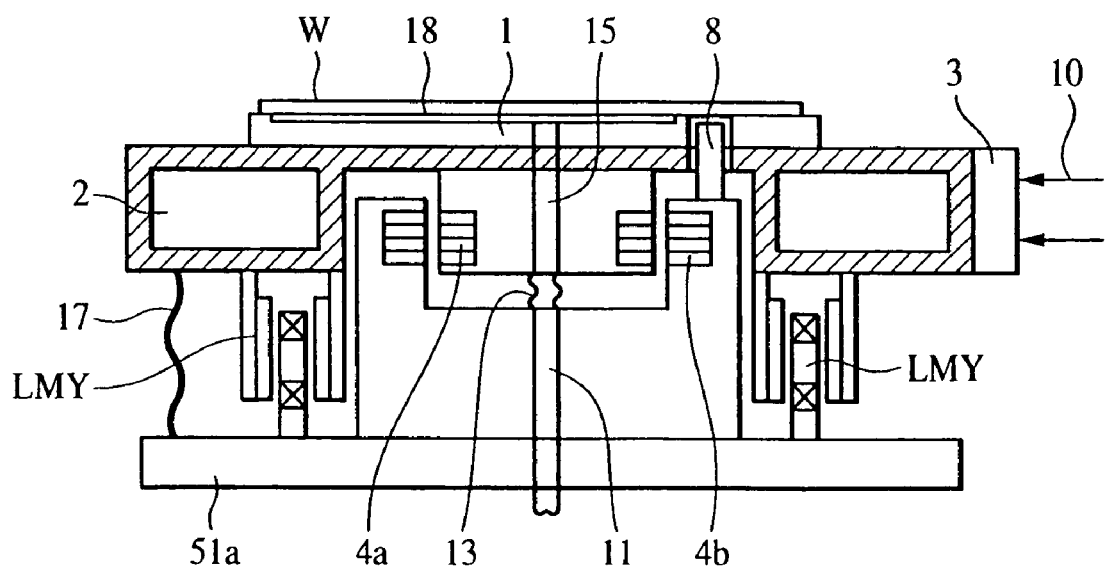
FIG. 7 is a sectional view of a positioning apparatus according to a second embodiment of the present invention cut along the center line.

FIG. 7 is a schematic sectional view of a positioning apparatus according to a second embodiment of the present invention which includes a mirror-combined hollow plate unit constructed by adhering or mechanically fixing an optical mirror 3 on a hollow plate unit 2 at a side surface thereof.

In order to avoid deformation of the hollow plate unit 2 due to the difference in coefficient of thermal expansion, the optical mirror 3 and the hollow plate unit 2 are formed of the same material. Since they are integrally formed using the same material, the displacement of the mirror 3 due to the acceleration of the stage movement can be prevented. In addition, since the mirror 3 is retained by the hollow plate unit 2 having a high rigidity, deformation of the mirror 3 can also be prevented.

Pipes, wires, etc., used for transferring electricity, gas, and liquid to the chuck 1 and sensors (not shown) mounted on the hollow plate unit 2 from the upper plate 51a of the X stage 51 are disposed at the central area or the most peripheral area of the hollow plate unit 2, so that the vibration transmissibility due to the pipes and the wires are reduced. In order to reduce the vibration transmissibility, as shown in FIG. 7, a relatively hard pipe which receives internal pressure from air, etc., is constructed such that the air flows through an induction pipe 11 formed at the central area of the fixed members of the electromagnetic couplings 4, a connecting tube 13 which provides vertical connection, an induction pipe 15 formed at the central area of the movable members of the electromagnetic couplings 4, and the central area of the hollow plate unit 2, and is supplied to a chucking vacuum groove 18 formed in the chuck 1.

In the above-described construction, an element which determines the vibration transmissibility is the connecting tube 13. Since the connecting tube 13 is disposed at the central area, asymmetric interference does not easily occur and the controllability can be prevented from being degraded. In addition to disposing the connecting tube 13 at the central area, the length thereof is preferably increased and it is preferably formed in a helical shape in order to reduce the influence of the connecting tube 13. Cables having a relatively high flexibility such as an electric cable 17 are preferably disposed at the periphery of the hollow plate unit 2 since the influence on vibration is small. Signal cables are preferably disposed at the periphery rather than being disposed at the center similarly to the air pipe tube, so that broken wires can be easily exchanged.

Figure 9:
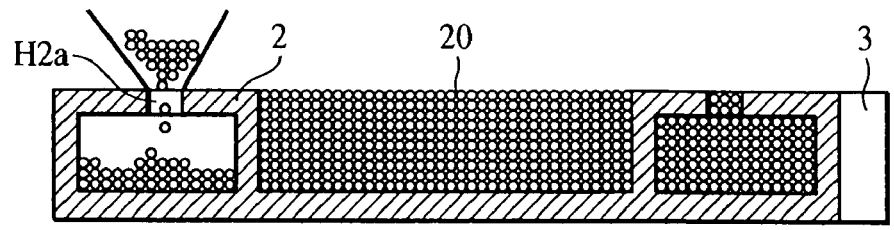
FIG. 9 is a diagram showing a manner in which the hollow plate unit according to the embodiments of the present invention is processed.

Next, a method for processing the hollow plate unit 2 will be described. When a finishing process of the optical mirror surface is performed, first, the mirror 3 is fixed to the hollow plate unit 2 as described above. Then, as shown in FIG. 9, particles (spherical or cylindrical) 20 are injected into the hollow section of the hollow structure through the through holes H2a formed in the hollow plate unit 2 for allowing the ambient gas to pass therethrough. By injecting the particles 20, the weight of the hollow section filled with the particles 20 is made the same as the weight obtained if the hollow section is filled with the same material as the material of the hollow structure. In the case in which the particles 20 have a cylindrical shape and are arranged orderly and the specific gravity of the SiC composite is 3.0, the specific gravity of the particles 20 are determined as 3.8. Accordingly, particles formed of alumina ceramics can be used.

Figure 10:
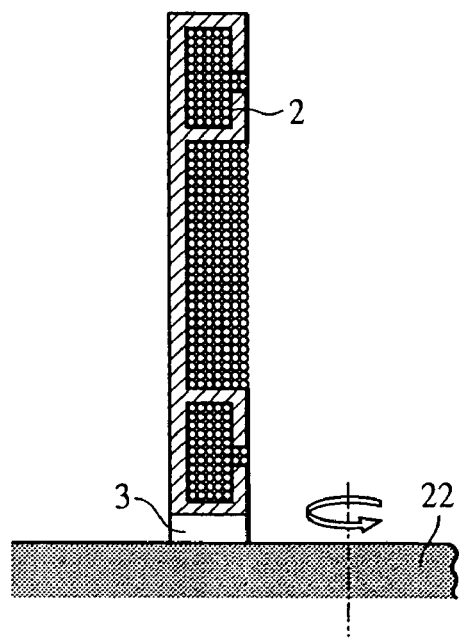
FIG. 10 is a diagram showing a manner in which a mirror surface of the hollow plate unit according to the present invention is subjected to a lapping process.
Figure 11:
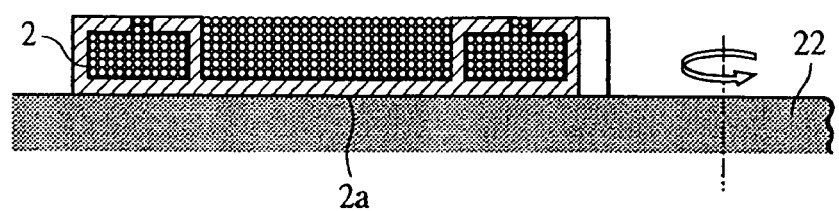
FIG. 11 is a diagram showing a manner in which a chuck-attaching surface of the hollow plate unit according to the present invention is subjected to a finishing process.
Figure 12:
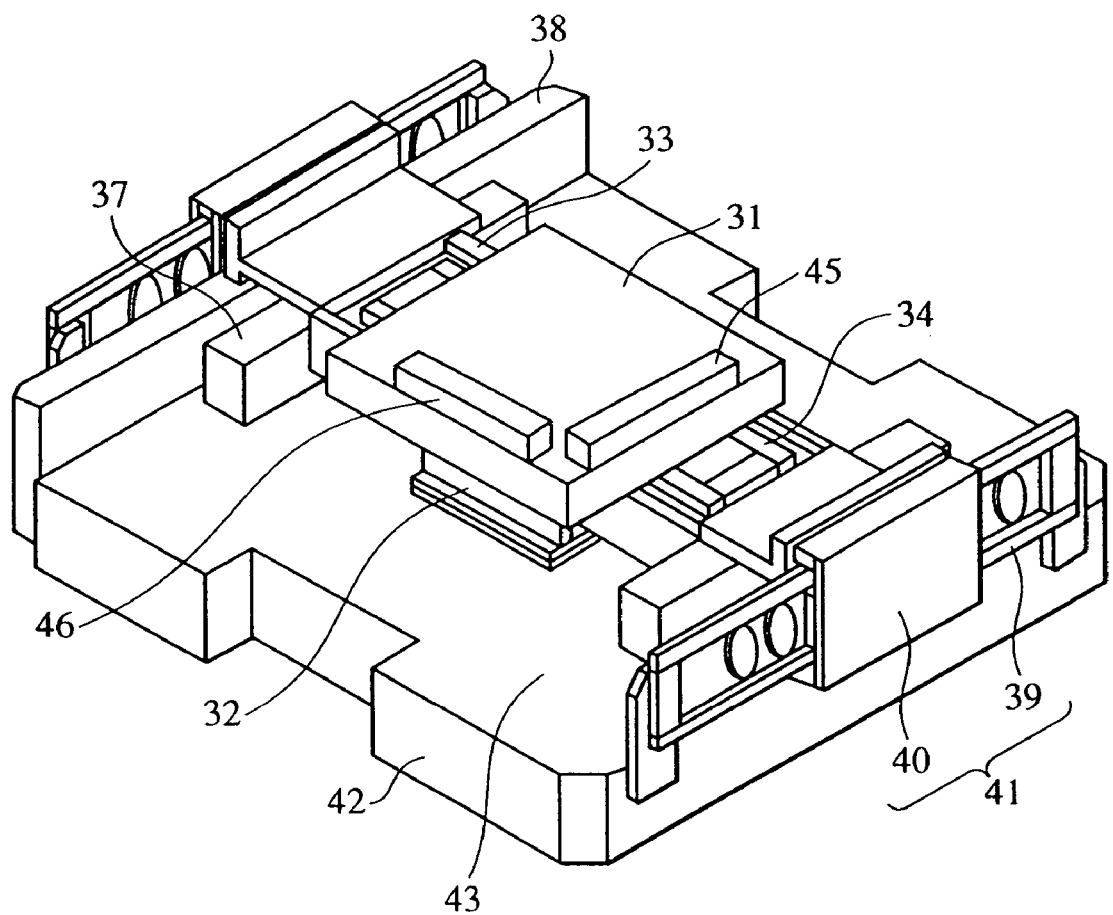
FIG. 12 is a perspective view of a known positioning apparatus.
Figure 13:
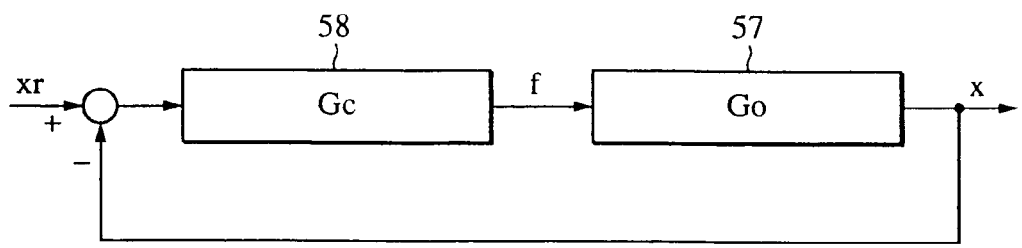
FIG. 13 is a control block diagram for each degree of freedom of the known positioning apparatus.
Figure 14:
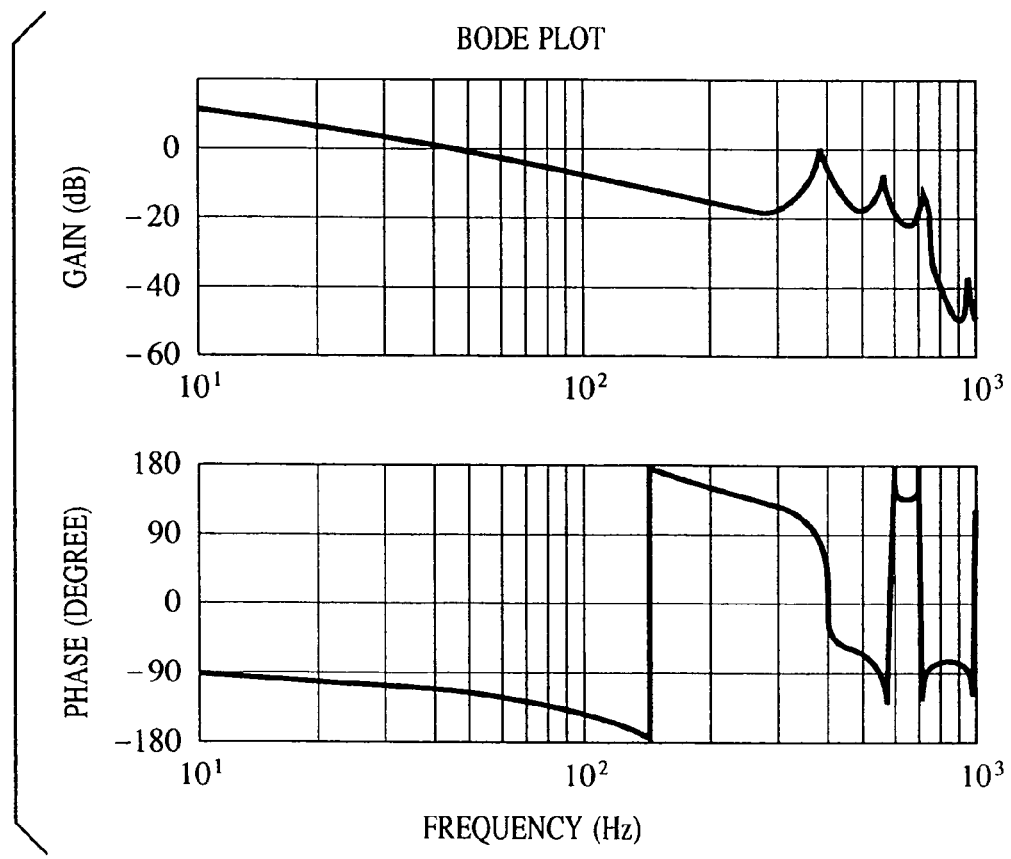
FIG. 14 is a diagram showing gain/phase characteristics of the control system of the known positioning apparatus.
Figure 15:
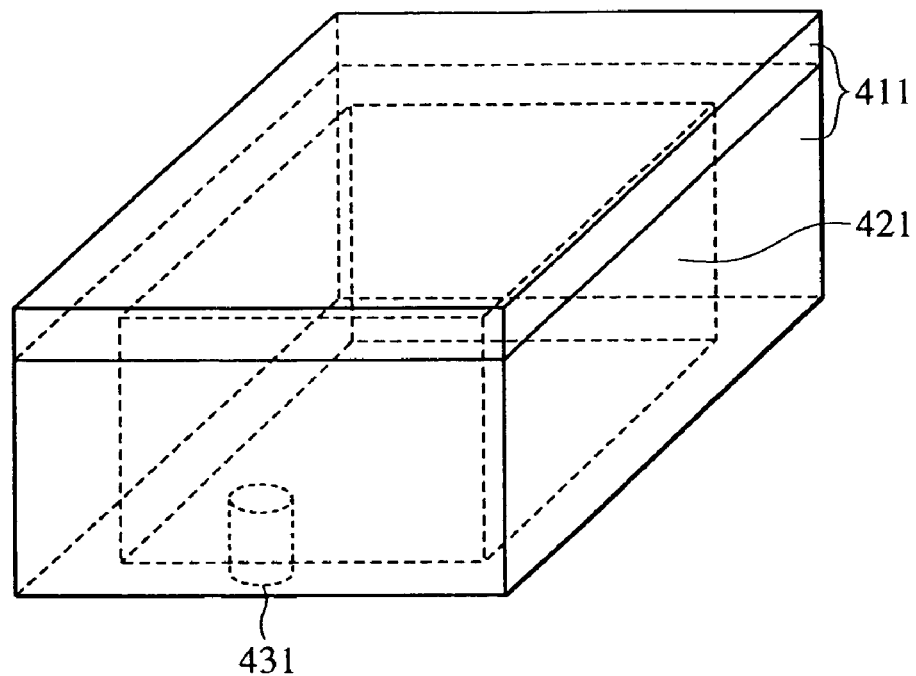
FIG. 15 is a perspective view showing a hollow structure of a known stage component.
Figure 16:
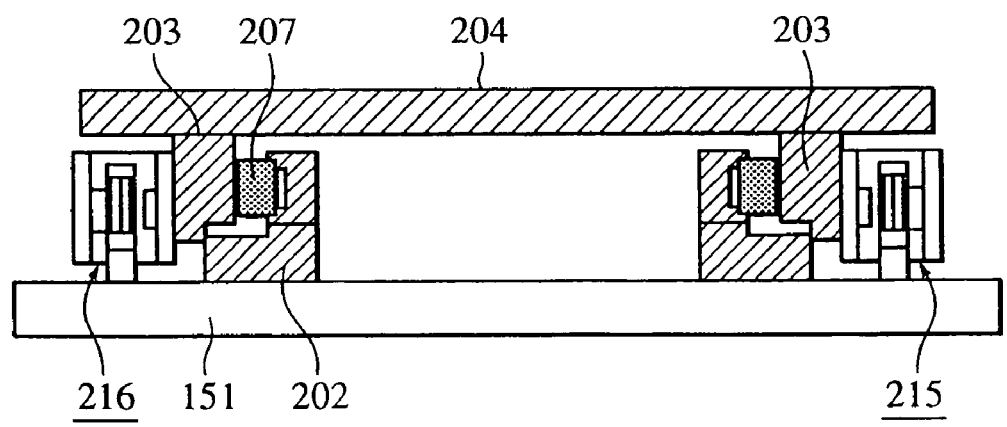
FIG. 16 is a sectional view of a θZT driving mechanism mounted on a known stage device.

When the particles 20 are injected, the surface pressure applied during grinding, lapping, and polishing processes is made the same as the surface pressure applied when a solid plate is used. In particular, when a high-precision flat surface is formed by using a lapping plate 22, the amount of processing varies in accordance with the surface pressure. However, this can be compensated for by filling the hollow section with the particles 20. FIG. 10 is a diagram showing a manner in which the surface of the mirror 3 is subjected to a lapping process. FIG. 11 is a diagram showing a manner in which the surface 2a of the hollow plate unit 2, which receives the chuck, is subjected to a finishing process. This method is not limited to the case in which the surface of the mirror 3 of the hollow plate unit 2 is processed, and may also be applied to other hollow components whose surface must have the flatness of 1 μm or less such as hollow guides, etc.

Third Embodiment

Figure 8:
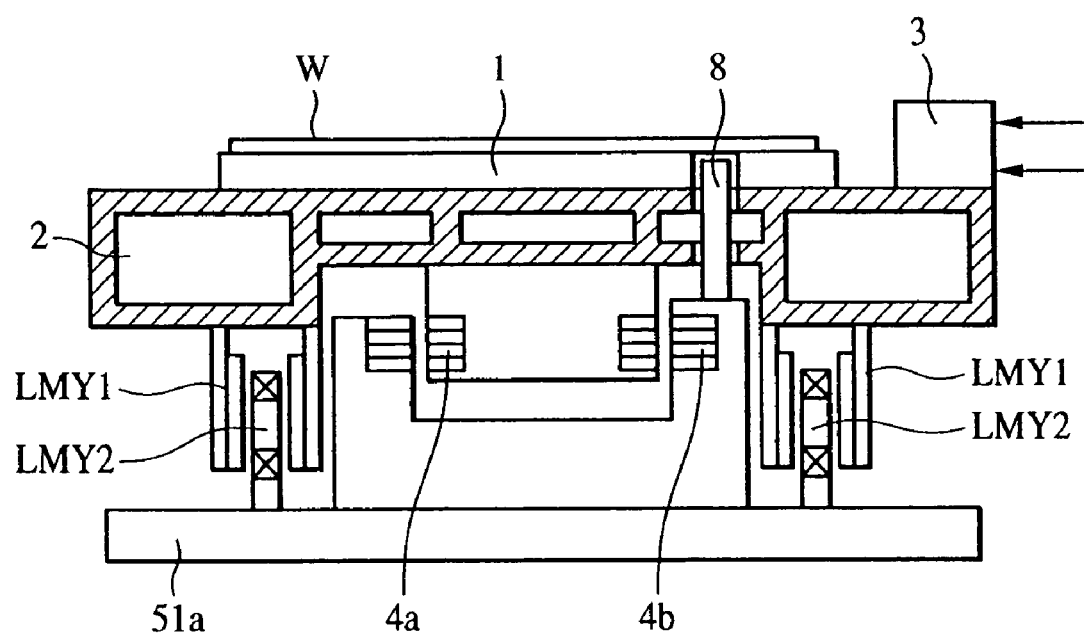
FIG. 8 is a sectional view of a positioning apparatus according to a third embodiment of the present invention cut along the center line.

FIG. 8 is a diagram showing a positioning apparatus according to a third embodiment of the present invention. In FIG. 2, the hollow plate unit 2 includes a solid-plate area at a region where the movable members 4a of the electromagnetic couplings 4 are attached. However, in such a case, the hollow plate unit 2 will be deformed if the acceleration applied to the electromagnetic couplings 4 is large. When the hollow plate unit 2 is deformed, the chuck 1 is also deformed, and as a result, the wafer W is also deformed so that an alignment error occurs. Therefore, according to the third embodiment of the present invention, in order to increase the strength of the hollow plate unit 2, the region of the hollow plate unit 2 where the movable members 4a of the electromagnetic couplings 4 are attached is also formed in a hollow structure instead of merely increasing the thickness thereof, so that the weight is reduced and the rigidity is increased.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A positioning apparatus which moves an object, said apparatus comprising:
   a first plate unit that retains the object; and
   a second plate unit that retains said first plate unit, said second plate unit being composed of a ceramic material and comprising a hollow structure having a closed hollow section, said hollow structure including a rib and at least one hole in the closed hollow section for providing a passageway between an interior and an exterior of the hollow section.

2. A positioning apparatus according to claim 1, wherein said second plate unit includes an upper plate and a lower plate that are formed integrally with said rib.

3. A positioning apparatus according to claim 1, wherein said second plate unit includes an upper plate, a lower plate, and a plurality of side plates surrounding said upper plate and said lower plate, and said rib extends from one of said plurality of side plates at an intermediate region thereof to an intermediate region of another of said plurality of side plates.

4. A positioning apparatus according to claim 1, wherein said rib comprises a first rib unit having a diamond cross section, a second rib unit disposed within said first rib unit having a rectangular cross section, and a third rib unit disposed within said second rib unit having a circular cross section.

5. A positioning apparatus according to claim 1, wherein said rib comprises a first rib unit having a rectangular shape in cross section and a second rib unit having a diamond shape in cross section, said first and second rib units being alternately disposed inside each other and bonded to each other.

6. A positioning apparatus according to claim 5, wherein said second plate unit comprises at least one of a low thermal expansion material having a coefficient of thermal expansion of 1.0e−6 (1/° C.) or less, an inorganic fiber composite, and a SiC composite containing SiC and Si.

7. A positioning apparatus according to claim 6, wherein said positioning apparatus serves as a substrate-moving stage in a semiconductor exposure apparatus, and wherein the object is either a photosensitive substrate or an original plate having an exposure pattern.

8. A positioning apparatus according to claim 1, wherein said first plate unit and said second plate unit are formed of a same material and said first plate unit includes a hollow structure.

9. A positioning apparatus according to claim 1, wherein said second plate unit includes a third plate unit that determines a relative position of the object and includes a plurality of optical mirrors, said third plate unit being composed of a same material as said second plate unit, said positioning apparatus further comprising a first actuator unit that moves the object with six degrees of freedom to a predetermined position by an electromagnetic force and a mechanism for supporting said second plate unit against gravity.

10. A positioning apparatus according to claim 9, further comprising:
   a second actuator unit that moves said first plate unit in X and Y directions in long strokes; and a fourth plate unit that is moved by said second actuator unit and supports said first actuator unit and said mechanism for supporting said second plate unit against gravity.

11. A positioning apparatus according to claim 10, wherein said fourth plate. unit includes at least three supporting rods for temporarily retaining the object when the object is moved from a conveyor hand to said first plate unit, said supporting rods extending through said first plate unit and said second plate unit and projecting from a top surface of said first plate unit in accordance with a vertical movement of said second plate unit by said first actuator unit.

12. A positioning apparatus according to claim 10, further comprising at least one of a pipe and a wire for transferring at least one of electricity, gas, and liquid supplied from said fourth plate unit to said second plate unit, said at least one of the pipe and the wire being disposed at either a central area or a peripheral area of said second plate unit.

13. A positioning apparatus according to claim 9, wherein said first actuator unit includes at least three Lorentz force actuators for moving the object in the horizontal direction and the yaw direction to the predetermined position and at least four electromagnetic actuators which are disposed concentrically and which modulate an acceleration for moving the object, each one of said at least four electromagnetic actuators including a movable member affixed to said hollow structure of said second plate unit, the hollow section of said hollow structure being an open area at a central region of said hollow structure, the open area serving to reduce the distance between the center of gravity of said second plate unit and a power point of each of said Lorentz force actuators and said electromagnetic actuators.

14. A positioning apparatus according to claim 13, wherein said Lorentz force actuators include coils and magnets that are arranged such that a thrust constant is within several percent of a maximum thrust constant when the object is at a position where an exposure process is performed.

15. A positioning apparatus according to claim 9, wherein:
the third plate unit is mechanically affixed to the second plate unit; and
the optical mirrors comprise mirror surfaces formed on the third plate unit for determining a relative position of the object.

16. A positioning apparatus according to claim 1, further comprising at least three Lorentz force actuators for controlling the object in a vertical direction, a pitch-direction, and a roll-direction.

17. A positioning apparatus according to claim 1, further comprising a weight-compensation mechanism that generates a force corresponding to a total weight of said second plate unit and components mechanically fixed to said second plate unit in order to support the total weight against gravity.

18. A positioning apparatus which moves an object, said apparatus comprising:
a base plate unit;
a first plate unit that is movable with respect to said base plate and retains the object; and
a second plate unit that retains said first plate unit, said second plate unit being composed of a ceramic material and comprising a hollow structure having a closed hollow section, said hollow structure including a rib and at least one hole in the closed hollow section for providing a passageway between an interior and an exterior of the hollow section.

19. A positioning apparatus according to claim 18, further comprising an actuator between said second plate unit and said base plate unit, and wherein said second plate unit has an open area at the position of said actuator.

* * * * *

UNITED STATES PATENT AND TRADEMARK OFFICE
CERTIFICATE OF CORRECTION

| | | |
|---|---|---|
| PATENT NO. | : 7,075,624 B2 | Page 1 of 1 |
| APPLICATION NO. | : 10/931991 | |
| DATED | : July 11, 2006 | |
| INVENTOR(S) | : Hiroyoshi Kubo | |

It is certified that error appears in the above-identified patent and that said Letters Patent is hereby corrected as shown below:

COLUMN 17:
Line 6, "plate." should read --plate--.

Signed and Sealed this

Ninth Day of January, 2007

JON W. DUDAS
*Director of the United States Patent and Trademark Office*